United States Patent
Lin et al.

(10) Patent No.: US 11,756,839 B2
(45) Date of Patent: Sep. 12, 2023

(54) METHOD FOR MANUFACTURING METAL OXIDE SEMICONDUCTOR TRANSISTOR

(71) Applicant: Powerchip Semiconductor Manufacturing Corporation, Hsinchu (TW)

(72) Inventors: Wan-Yan Lin, Miaoli County (TW); Yu-Chieh Su, Tainan (TW); Ming-Chien Chiu, Kaohsiung (TW); Mao-Hsing Chiu, Yilan County (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 84 days.

(21) Appl. No.: 17/226,097

(22) Filed: Apr. 9, 2021

(65) Prior Publication Data

US 2022/0216113 A1 Jul. 7, 2022

(30) Foreign Application Priority Data

Jan. 4, 2021 (TW) .................................. 110100060

(51) Int. Cl.
*H01L 21/8238* (2006.01)
*H01L 29/66* (2006.01)

(52) U.S. Cl.
CPC .. *H01L 21/823864* (2013.01); *H01L 29/6653* (2013.01); *H01L 29/6656* (2013.01)

(58) Field of Classification Search
CPC ..... H01L 21/823468; H01L 21/823864; H01L 29/6653; H01L 29/6656; H01L 29/66689
See application file for complete search history.

(56) References Cited

U.S. PATENT DOCUMENTS

| 2002/0158289 A1* | 10/2002 | Kim .................... H01L 29/6659 257/E21.59 |
| 2004/0043573 A1* | 3/2004 | Juengling ......... H01L 29/66545 438/303 |
| 2005/0179090 A1* | 8/2005 | Ohta ............... H01L 21/823468 257/E21.627 |

(Continued)

FOREIGN PATENT DOCUMENTS

| TW | 430905 | 4/2001 |
| TW | 200847433 | 12/2008 |

OTHER PUBLICATIONS

"Office Action of Taiwan Counterpart Application", dated Jul. 15, 2021, p. 1-p. 8.

*Primary Examiner* — Bryan R Junge
(74) *Attorney, Agent, or Firm* — JCIPRNET (57) ABSTRACT

A method for manufacturing a MOS transistor includes following. A gate stack structure and a hardmask layer on the gate stack structure are sequentially formed on a substrate. A first spacer is formed on sidewalls of the gate stack structure and the hardmask layer. A photoresist layer is formed on a sidewall of the first spacer. A top surface of the photoresist layer is higher than a top surface of the gate stack structure. The hardmask layer and a portion of the first spacer are removed to expose the top surface of the gate stack structure. A top surface of a remaining first spacer is higher than the top surface of the gate stack structure. The photoresist layer is removed. A second spacer is formed on a sidewall of the remaining first spacer. A top surface of the second spacer is higher than the top surface of the gate stack.

12 Claims, 6 Drawing Sheets

(56) References Cited

U.S. PATENT DOCUMENTS

| | | | |
|---|---|---|---|
| 2005/0227446 A1 | 10/2005 | Kao et al. | |
| 2006/0183281 A1* | 8/2006 | Cremonesi | H01L 27/11526 |
| | | | 257/E21.209 |
| 2007/0275532 A1* | 11/2007 | Chidambarrao | H01L 29/66545 |
| | | | 257/E21.336 |
| 2008/0124880 A1* | 5/2008 | Lin | H01L 29/6659 |
| | | | 438/305 |
| 2008/0261385 A1* | 10/2008 | Jawarani | H01L 29/7843 |
| | | | 438/517 |
| 2009/0186475 A1* | 7/2009 | Ting | H01L 21/823864 |
| | | | 257/E21.294 |
| 2010/0136762 A1* | 6/2010 | Beyer | H01L 29/517 |
| | | | 257/E21.409 |
| 2011/0159657 A1* | 6/2011 | Griebenow | H01L 21/823807 |
| | | | 438/303 |
| 2012/0156837 A1* | 6/2012 | Scheiper | H01L 21/823814 |
| | | | 257/E21.409 |
| 2014/0342514 A1* | 11/2014 | Yan | H01L 21/823864 |
| | | | 438/199 |
| 2017/0194495 A1* | 7/2017 | Li | H01L 29/66477 |

* cited by examiner

METHOD FOR MANUFACTURING METAL OXIDE SEMICONDUCTOR TRANSISTOR

CROSS-REFERENCE TO RELATED APPLICATION

This application claims the priority benefit of Taiwan application serial no. 11010000, filed on Jan. 4, 2021. The entirety of the above-mentioned patent application is hereby incorporated by reference herein and made a part of this specification.

BACKGROUND

Technical Field

The disclosure relates to a method for manufacturing a semiconductor device, and, more particularly, to a method for manufacturing a metal oxide semiconductor transistor.

Description of Related Art

With the increase in the integration of metal oxide semiconductor (MOS) devices, it is generally necessary to follow the scale-down design rule according to the manufacturing method for an integrated circuit device to reduce the size of a circuit structure device. In the conventional process for manufacturing a metal oxide semiconductor (MOS) transistor, it is common to add a lightly doped drain (LDD) region between the channel region and each source/drain region to reduce the hot electron effect. However, the high-concentration LDD end often overlaps with the gate electrode layer after annealing and heat treatments are performed. As a result, an abnormal bias voltage may easily occur and the performance may easily deteriorate in the device.

Forming a compensation spacer is one of the solutions to the above issue. A conventional process to form a compensation spacer is to form a spacer material layer on the gate structure, and then an etch-back process is performed to form a compensation spacer on the sidewall of the gate structure. However, due to the over-etching in the etch-back process, the height of the spacer is lower (lower than the height of the top surface of the gate structure), while the width of the spacer is also reduced. The smaller width and insufficient height of the spacer directly affect the range of the ion implantation region. Specifically, when the height of the spacer is insufficient, the spacer cannot block ions from being implanted. As a result, ions are still implanted to the region below the spacer, which results in a shift of the ion implantation region defined in advance.

SUMMARY

The embodiments of the disclosure provide a method for manufacturing a metal oxide semiconductor capable of effectively blocking ion implantation below a spacer.

An embodiment of the disclosure provides a method for manufacturing a metal oxide semiconductor, including the following steps. A gate stack structure and a hardmask layer on the gate stack structure are sequentially formed on a substrate. A first spacer is formed on a sidewall of the gate stack structure and a sidewall of the hardmask layer. A photoresist layer is formed on a sidewall of the first spacer. A top surface of the photoresist layer is higher than a top surface of the gate stack structure. The hardmask layer and a portion of the first spacer are removed to expose the top surface of the gate stack structure. A top surface of the remaining first spacer is higher than the top surface of the gate stack structure surface. The photoresist layer is removed. A second spacer is formed on a sidewall of the remaining first spacer. A top surface of the second spacer is higher than the top surface of the gate stack structure.

In an embodiment of the disclosure, before the photoresist layer is formed, the method further includes that a first doped region is formed in the substrate. The first doped region is adjacent to the sidewall of the first spacer.

In an embodiment of the disclosure, the first doped region is a lightly doped drain region.

In an embodiment of the disclosure, a method for forming a photoresist layer may include the following steps. A photoresist material layer is formed on the substrate to cover the substrate, the first spacer, and the hardmask layer. A portion of the photoresist material layer is removed to expose a top surface of the hardmask layer and a portion of the sidewall of the first spacer, and form the photoresist layer.

In an embodiment of the disclosure, a material of the photoresist material layer is, for example, a carbon-based material or a polymer material.

In an embodiment of the disclosure, a material of the hardmask layer is, for example, silicon oxide or silicon oxynitride.

In an embodiment of the disclosure, a material of the first spacer is, for example, silicon oxide, silicon nitride, or silicon oxynitride.

In an embodiment of the disclosure, the first spacer includes a first sub-spacer and a second sub-spacer. The first spacer is formed on the sidewall of the gate stack structure, and the second sub-spacer is formed on a sidewall of the first sub-spacer.

In an embodiment of the disclosure, a material of the first sub-spacer is, for example, silicon oxide or silicon oxynitride.

In an embodiment of the disclosure, a material of the second sub-spacer is, for example, silicon nitride.

In an embodiment of the disclosure, forming the second spacer includes the following steps. A spacer material layer is conformally formed on the substrate, the first spacer, and the gate stack structure by performing an atomic layer deposition (ALD) process or a plasma enhanced ALD process. A portion of the spacer material layer is removed to expose the top surface of the gate stack structure.

In an embodiment of the disclosure, a material of the second spacer is, for example, silicon nitride.

In an embodiment of the disclosure, the method further includes that a second doped region is formed in the substrate. The second doped region is adjacent to a sidewall of the second spacer.

In an embodiment of the disclosure, the second doped region may be a source/drain region.

The disclosure provides a metal oxide semiconductor transistor including a substrate, a gate stack structure, a first spacer, and a second spacer. The gate stack structure is disposed on the substrate. The first spacer is disposed on a sidewall of the gate stack structure. The second spacer is disposed on a sidewall of the first spacer. A top surface of the second spacer is higher than a top surface of the gate stack structure.

In an embodiment of the disclosure, a top surface of the first spacer is higher than the top surface of the gate stack structure.

In an embodiment of the disclosure, the metal oxide semiconductor transistor further includes a first doped region disposed in the substrate and laterally adjacent to the sidewall of the first spacer.

In an embodiment of the disclosure, the metal oxide semiconductor transistor further includes a second doped region disposed in the substrate and laterally adjacent to a sidewall of the second spacer.

In an embodiment of the disclosure, a material of the first spacer is, for example, silicon oxide, silicon nitride, or silicon oxynitride.

In an embodiment of the disclosure, a material of the second spacer is, for example, silicon nitride.

Based on the above, in the metal oxide semiconductor transistor and the manufacturing method thereof according to the embodiments of the disclosure, by controlling the top surface of the photoresist layer to be higher than the top surface of the gate electrode layer, the height of the second spacer formed subsequently may be higher than the top surface of the gate electrode layer. Thus, the second spacer with a sufficient height may effectively block ions from being implanted into the substrate below the second spacer. Therefore, a process window shift occurring in the conventional ion implantation process due to an insufficient height of the spacer may be avoided.

DETAILED DESCRIPTION OF DISCLOSED EMBODIMENTS

The following disclosure provides many different embodiments or examples for implementing different features of the provided subject matter. The specific examples of the elements and configuration described below are for the purpose of conveying the disclosure in a simplified manner. Of course, these are just examples and not configured to limit the disclosure. For example, in the following description, forming a second feature above a first feature or on a first feature may include an embodiment in which the second feature and the first feature are formed in direct contact, and may also include an embodiment in which an additional feature may be formed between the second feature and the first feature such that the second feature and the first feature may not be in direct contact. In addition, the same reference numerals and/or letters may refer to the same or similar parts in various embodiments of the disclosure. The repetition of the reference numerals is for simplicity and clarity, and does not denote the relationship between the various embodiments and/or configuration to be discussed.

In addition, in order to easily describe the relationship between one element or feature and another element or feature shown in the drawings, spatial relative terms such as "under", "below", "lower part", "on", "above", "upper part", and similar terms may be used in the present specification. In addition to the orientations depicted in the drawings, the spatial relative terms are intended to cover different orientations of elements in use or operation. The device may be otherwise oriented (rotated by 90 degrees or in other orientations), and the spatial relative terms used herein are interpreted accordingly.

FIGS. 1A to 1G are schematic cross-sectional views of a manufacturing process of a metal oxide semiconductor transistor according to an embodiment of the disclosure.

Figure 1A:
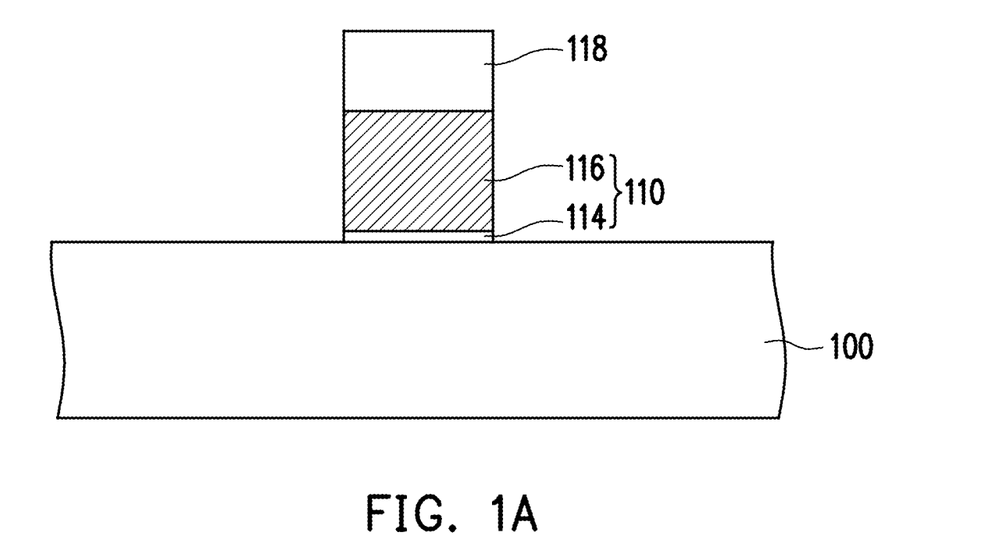
FIGS. 1A to 1G are schematic cross-sectional views of a manufacturing process of a metal oxide semiconductor transistor according to an embodiment of the disclosure.

Referring to FIG. 1A, a gate stack structure 110 and a hardmask layer 118 on the gate stack structure 110 are sequentially formed on a substrate 100. The substrate 100 may be, for example, a semiconductor substrate, a semiconductor compound substrate, or a semiconductor over insulator (SOI) substrate, but the disclosure is not limited thereto. In FIG. 1A, one gate stack structure 110 is illustrated, but the number of the gate stack structures 110 is merely an example for an illustrative purpose and the structure of the disclosure is not limited thereto. In an embodiment, the gate stack structure 110 may include a polysilicon gate structure or an alternative metal gate structure. In an embodiment, the gate stack structure 110 includes a gate dielectric layer 114 and a gate electrode layer 116 on the gate dielectric layer 114. In an embodiment, a material of the gate dielectric layer 114 is, for example, silicon oxide, silicon oxynitride, silicon nitride, or a combination thereof. In an embodiment, a material of the gate dielectric layer 114 is, for example, a high-k dielectric material. In an embodiment, a material of the gate electrode layer 116 includes, for example, doped or undoped polysilicon or a metal-containing conductive material. In an embodiment, the metal-containing conductive material is, for example, aluminum (Al), copper (Cu), tungsten (W), cobalt (CO), titanium (Ti), tantalum (Ta), ruthenium (Ru), TiN, TiAl, TiAlN, TaN, TaC, NiSi, CoSi, or a combination thereof. In an embodiment, a material of the hardmask layer 118 includes, for example, silicon oxide or silicon oxynitride.

In an embodiment, the gate stack structure 110 and the hardmask layer 118 are formed through the following steps. A gate dielectric material layer (not shown), a gate electrode material layer (not shown), and a hardmask material layer (not shown) are sequentially formed on the substrate 100. Next, the hardmask material layer, the gate electrode material layer, and the gate dielectric material layer are patterned to form the gate dielectric layer 114, the gate electrode layer 116, and the hardmask layer 118. A process for forming the gate dielectric material layer includes, for example, thermal oxidation. A process for forming the gate electrode material layer includes, for example, chemical vapor deposition or physical vapor deposition. A process for forming the hardmask material layer includes, for example, chemical vapor deposition or physical vapor deposition.

Figure 1B:
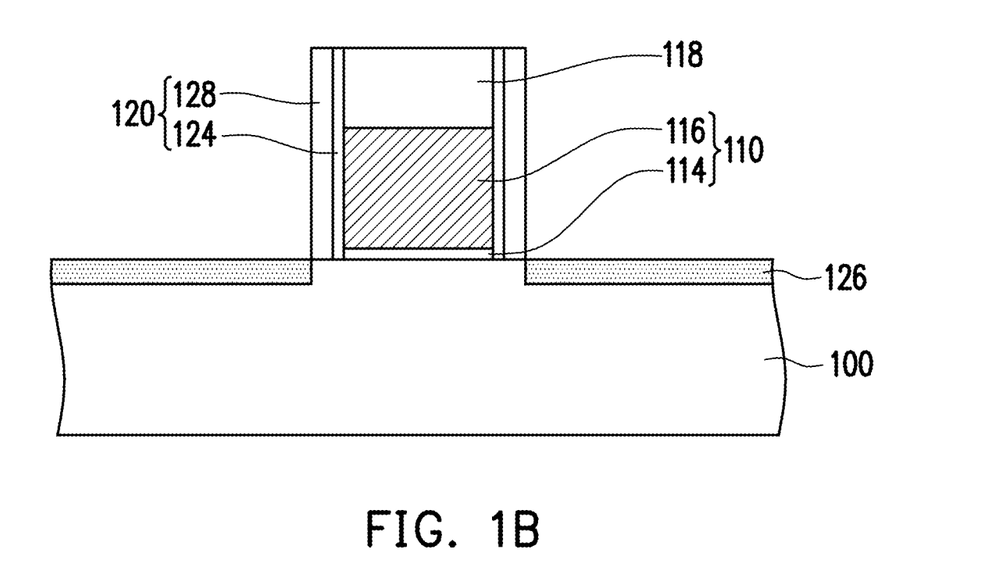

Referring to FIG. 1B, a first spacer 120 is formed on a sidewall of the gate stack structure 110 and a sidewall of the hardmask layer 118. In an embodiment, the first spacer 120 may be a single-layer structure. A material of the first spacer 120 includes, for example, silicon oxide, silicon nitride, or silicon oxynitride. A process for forming the first spacer 120 includes, for example, forming a conformal spacer material layer (not shown) on the substrate 100, and then removing a portion of the spacer material layer by performing anisotropic etching to form the first spacer 120 on the sidewall of the gate stack structure 110 and the sidewall of the hardmask layer 118.

In an embodiment, the first spacer 120 may be a multilayer structure. The first spacer 120 may include a first sub-spacer 124 and a second sub-spacer 128. The first sub-spacer 124 is formed on the opposite sidewalls of the gate stack structure 110 and the hardmask layer 118, and the second sub-spacer 128 is formed on sidewalls of the first sub-spacer 124. In an embodiment, a material of the first sub-spacer 124 includes, for example, silicon oxide or silicon oxynitride. A material of the second sub-spacer 128 includes, for example, silicon nitride. In an embodiment, a conformal oxide layer (not shown) may be first formed on the substrate 100, and then a portion of the oxide layer may be removed by performing anisotropic etching to form the first sub-spacer 124 on the sidewalls of the gate stack structure 110 and the hardmask layer 118. Next, a process for forming the second sub-spacer 128 includes, for example, forming a conformal nitride layer (not shown) on the substrate 100, and then removing a portion of the nitride layer by performing anisotropic etching to form the second sub-spacer 128 on the sidewall of the first sub-spacer 124. In an embodiment, the material of the first sub-spacer 124 and the material of the second sub-spacer 128 are different. In an embodiment, a thickness of the first sub-spacer 124 is less than a thickness of the second sub-spacer 128, and the first sub-spacer 124 may be used as a liner. The first sub-spacer 124 may be configured to improve the adhesion and the stress, etc., between the second sub-spacer 128 and the gate stack structure 110.

Continuing to refer to FIG. 1B, a first doped region 126 is selectively formed in the substrate 100. Specifically, the first doped region 126 is formed in the substrate 100 exposed on two sides of the gate stack structure 110. A process for forming the first doped region 126 includes, for example, performing an ion implantation process by using the gate stack structure 110, the hardmask layer 118, and the first spacer 120 as a mask, so that the first doped region 126 is laterally formed in the substrate 100 adjacent to a sidewall of the first spacer 120. An edge of the first doped region 126 is substantially aligned with the sidewall of the first spacer 120. In an embodiment, the first doped region 126 is a lightly doped drain (LDD) region.

Figure 1C:
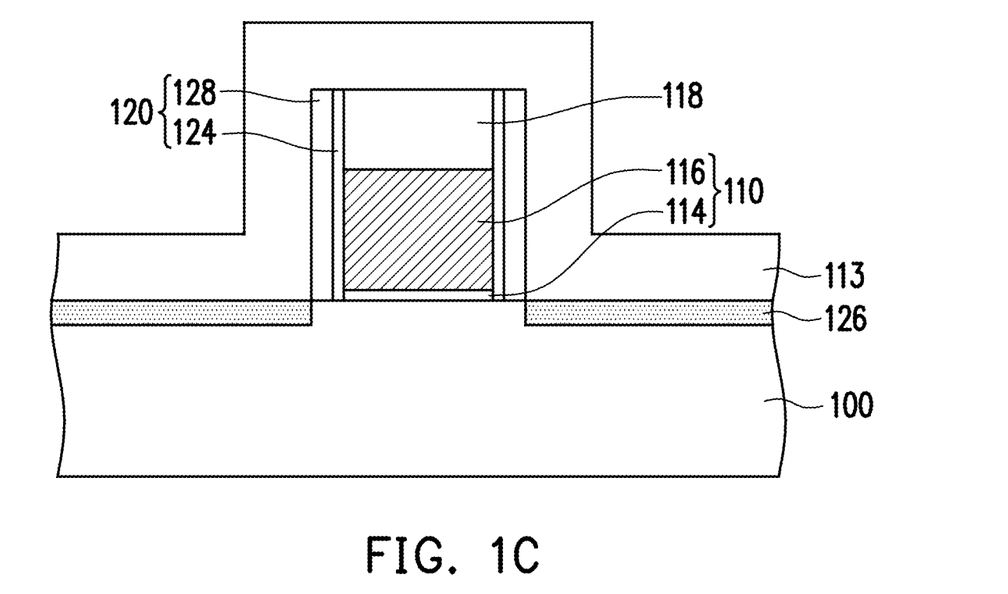

Referring to FIG. 1C, a photoresist material layer 113 is formed on the substrate 100 to cover the substrate 100, the first spacer 120, and the hardmask layer 118. In an embodiment, a material of the photoresist material layer 113 includes, for example, a carbon-based material or a polymer material.

Figure 1D:
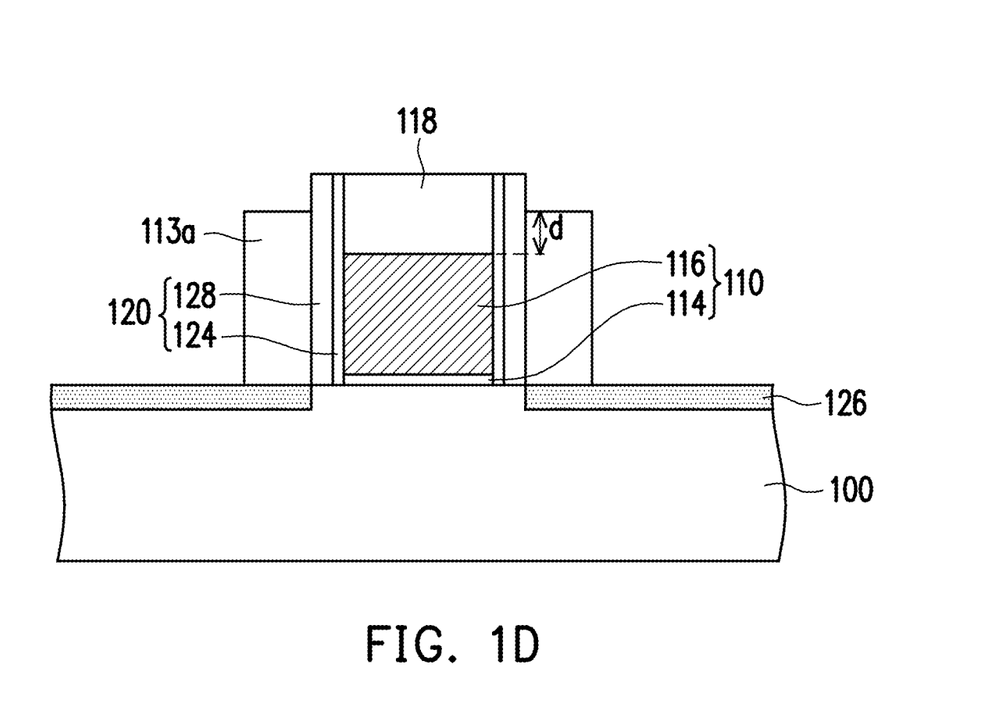

Referring to FIG. 1D, a portion of the photoresist material layer 113 is removed to expose a top surface of the hardmask layer 118 and form a photoresist layer 113a on the sidewall of the first spacer 120. In an embodiment, after the portion of the photoresist material layer 113 is removed, a portion of the sidewall of the first spacer 120 is also exposed. In the embodiment, the remaining photoresist material layer 113 after being etched serves as the photoresist layer 113a. In an embodiment, a top surface of the photoresist layer 113a is higher than a top surface of the gate electrode layer 116 of the gate stack structure 110. In the embodiment, a process for removing a portion of the photoresist material layer 113 includes, for example, an etch-back process. In an embodiment, an etching temperature is, for example, between 20° C. and 250° C. In an embodiment, $CF_4$, $O_2$, or a combination thereof may be used as the etching gas. A flow rate of $CF_4$ is, for example, between 5 sccm and 100 sccm, and a flow rate of $O_2$ is, for example, between 50 sccm to 300 sccm. In an embodiment, the photoresist material layer 113 is dry-etched by choosing a low temperature and a low flow rate.

By doing so, the etching rate of the photoresist material layer may be effectively controlled. Specifically, a remaining height of the photoresist material layer may be controlled by adjusting the etching time, so that a top surface of the photoresist layer 113a formed accordingly is higher than a top surface of the gate stack structure 110 (i.e., the top surface of the gate electrode layer 116). In this step, by controlling a distance d in which the top surface of the photoresist layer 113a is higher than the top surface of the gate stack structure 110 (i.e., the top surface of the gate electrode layer 116), a height of a second spacer 132a formed subsequently (see FIG. 1G) may be higher than the top surface of the gate electrode layer 116.

Figure 1E:
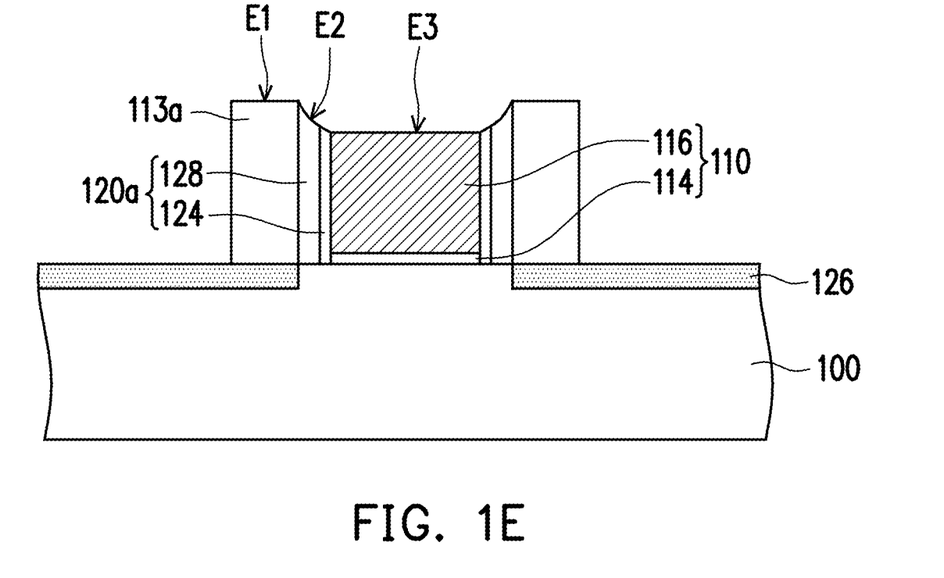

Referring to FIG. 1E, the hardmask layer 118 and a portion of the first spacer 120 are removed to expose the top surface of the gate stack structure 110 (i.e., the top surface of the gate electrode layer 116). In an embodiment, a process for removing the hardmask layer 118 and the portion of the first spacer 120 includes, for example, dry etching. In an embodiment, the hardmask layer 118 and the first spacer 120 are etched by using an etching gas or etchant having a higher etching selectivity for the hardmask layer 118 and the first spacer 120 than an etching selectivity for the photoresist layer 113a. In an embodiment, during the process of etching the hardmask layer 118 and the first spacer 120, a portion of the photoresist layer 113a is also etched at the same time. After the first spacer 120 is etched, the remaining first spacer 120 forms a first spacer 120a. Since the top surface of the photoresist layer 113a is higher than the top surface of the gate electrode layer 116 before the hardmask layer 118 is removed, and the etching gas or etchant used in the embodiment has a higher etching selectivity for the hard mask layer 118 and the first spacer 120 than the etching selectivity for the photoresist layer 113a, the closer to the photoresist layer 113a, the slower the etching. Therefore, after the hardmask layer 118 is removed, the top surface of the photoresist layer 113a and a top surface of the first spacer 120a are higher than the top surface of the gate stack structure 110 (i.e., the top surface of the gate electrode layer 116).

In an embodiment, an end portion E1 of the photoresist layer 113a and an end portion E2 of the first spacer 120a are convex relative to an end portion E3 of the gate electrode layer 116. In an embodiment, the end portion E1 of the photoresist layer 113a is convex relative to the end portion E2 of the first spacer 120a, and the end portion E2 of the first spacer 120a is convex relative to the end portion E3 of the gate electrode layer 116. In an embodiment, the end portion E2 of the first spacer 120a has a substantially flat surface. In an embodiment, the end portion E2 of the first spacer 120a has an inclined surface. Specifically, both the first sub-spacer 124 and the second sub-spacer 128 have inclined surfaces, and a top surface of the second sub-spacer 128 is higher than a top surface of the first sub-spacer 124. More specifically, the first spacer 120a has a surface inclined toward the gate electrode layer 116 from a point in contact with the photoresist layer 113a.

Figure 1F:
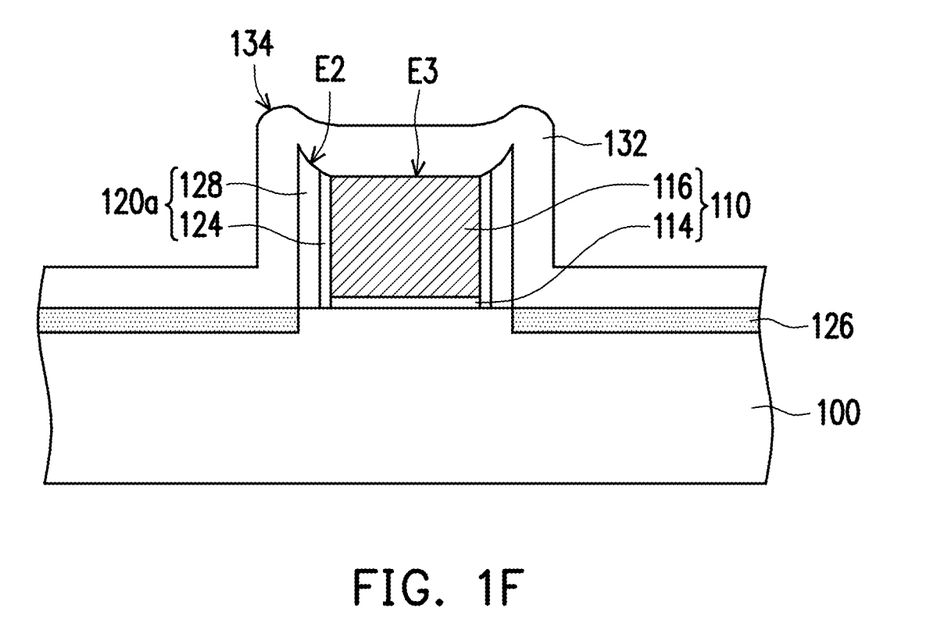
Figure 2:
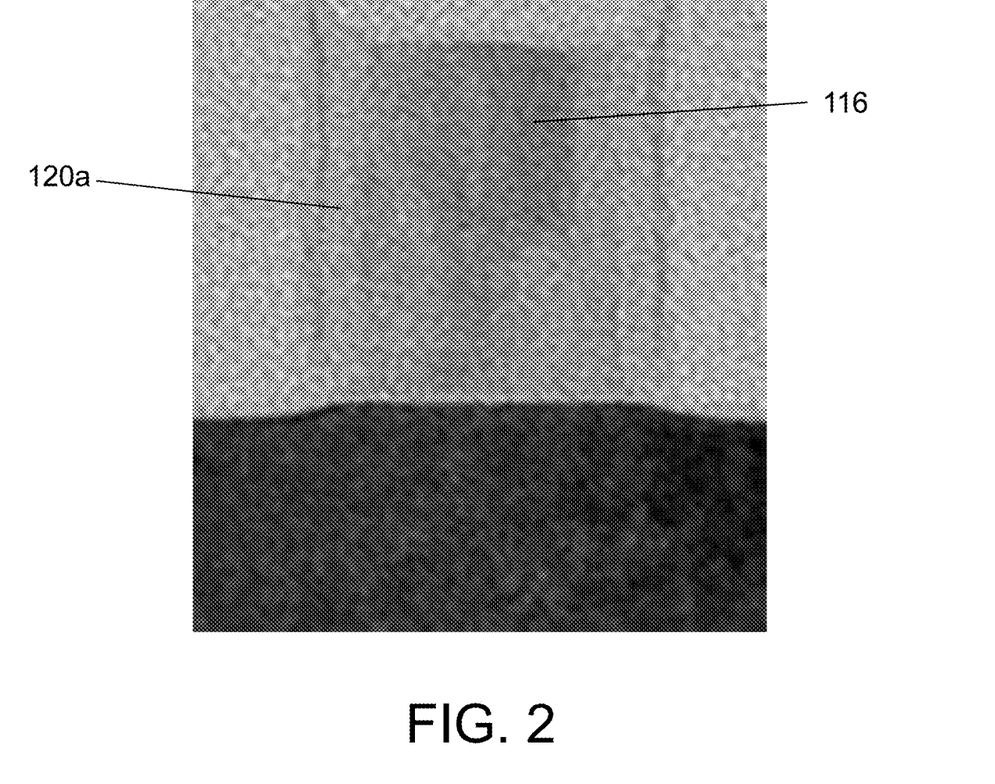
FIG. 2 is a cross-sectional view of the metal oxide semiconductor transistor of FIG. 1F observed by using a transmission electron microscope (TEM).

Referring to FIG. 1F, the photoresist layer 113a is removed. A process for removing the photoresist layer 113a includes, for example, an ashing process. After the photoresist layer 113a is removed, the top surface of the first spacer 120a remains higher than the top surface of the gate stack structure 110 (i.e., the top surface of the gate electrode layer 116). Specifically, after the photoresist layer 113a is removed, the end portion E2 of the first spacer 120a is still convex relative to the end portion E3 of the gate electrode layer 116. FIG. 2 is a cross-sectional view of the metal oxide semiconductor transistor in FIG. 1F observed by using a transmission electron microscope (TEM). It can be seen from FIG. 2 that the top surface of the first spacer 120a is higher than the top surface of the gate electrode layer 116.

Next, continuing to refer to FIG. 1F, a spacer material layer 132 is formed on the substrate 100. The spacer material layer 132 is substantially conformally formed on the substrate 100, the first spacer 120a, and the gate stack structure 110. A process for forming the spacer material layer 132 includes, for example, atomic layer deposition (ALD) or plasma-enhanced ALD (PEALD). In an embodiment, a material of the spacer material layer 132 includes, for example, silicon nitride.

Since the top surface of the first spacer 120a is higher than the top surface of the gate stack structure 110 (i.e., the end portion E2 of the first spacer 120a is convex relative to the end portion E3 of the gate electrode layer 116), a height of the spacer material layer 132 in the region of the first spacer 120a is greater than a height of the spacer material layer 132 in the region of the gate electrode layer 116. In an embodiment, the spacer material layer 132 forms a fang structure 134 at the top near the two ends of the first spacer 120a.

Figure 1G:
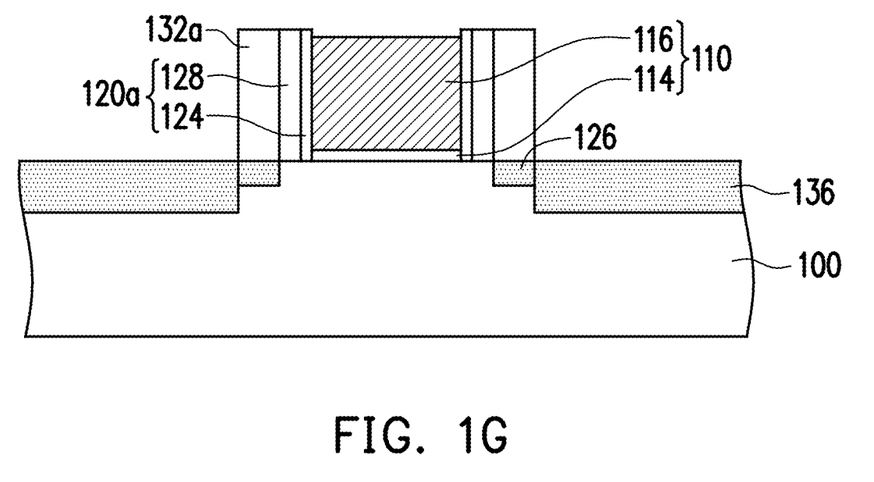

Referring to FIG. 1G, a portion of the spacer material layer 132 is removed to expose the top surface of the gate stack structure 110 (i.e., the top surface of the gate electrode layer 116) and form a second spacer 132a on a sidewall of the first spacer 120a. A process for removing the spacer material layer 132 includes, for example, dry etching. In the embodiment, a top surface of the second spacer 132a and the top surface of the first spacer 120a are higher than the top surface of the gate stack structure 110 (i.e., the top surface of the gate electrode layer 116). More specifically, a height from the top surface of the second spacer 132a to the substrate 100 and a height from the top surface of the first spacer 120a to the substrate 100 are greater than a height from the top surface of the gate stack structure 110 to the substrate 100.

Next, continuing to refer to FIG. 1G, a second doped region 136 is formed in the substrate 100. Specifically, the second doped region 136 is formed in the substrate 100 on both sides of the gate stack structure 110 and the second spacer 132a. A process for forming the second doped area 136 includes, for example, performing an ion implantation process by using the gate stack structure 110, the first spacer 120a, and the second spacer 132a as a mask, so that the second doped region 136 is laterally formed in the substrate 100 adjacent to a sidewall of the second spacer 132a. An edge of the second doped region 136 is substantially aligned with the sidewall of the second spacer 132a. In an embodiment, the ion implantation process is, for example, a heavy doping process. In an embodiment, the second doped region 136 is a source/drain region. So far, the manufacture of the metal oxide semiconductor transistor of the disclosure is completed.

Figure 3A:
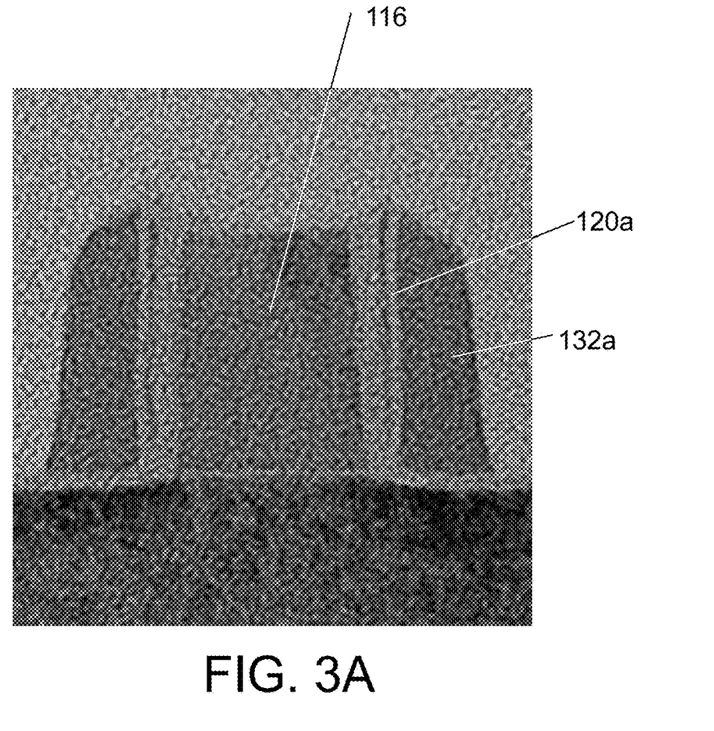
FIG. 3A is a cross-sectional view of a metal oxide semiconductor transistor having a compensation spacer according to the embodiment observed by using a TEM.
Figure 3B:
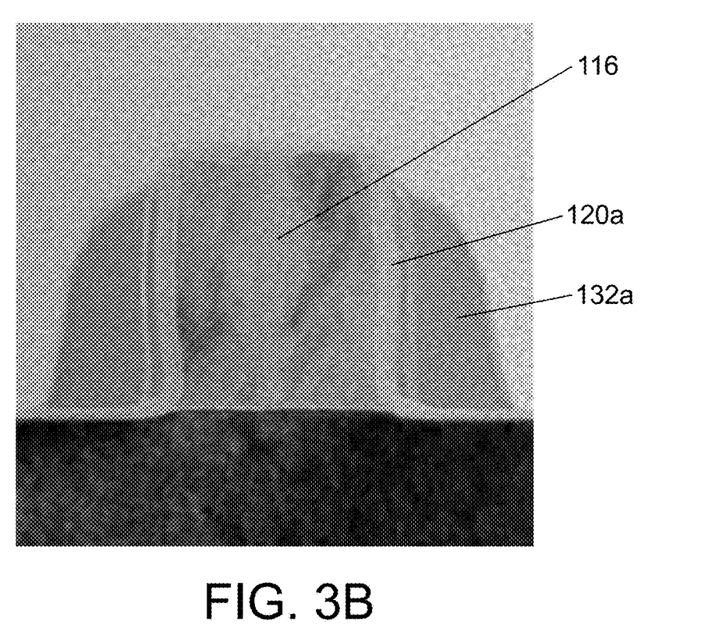
FIG. 3B is a cross-sectional view of a metal oxide semiconductor transistor having a compensation spacer manufactured according to a conventional manufacturing process observed by using a TEM.

FIG. 3A is a cross-sectional view of a metal oxide semiconductor transistor having a compensation spacer according to the embodiment observed by using a TEM. FIG. 3B is a cross-sectional view of a metal oxide semiconductor transistor having a compensation spacer manufactured according to a conventional manufacturing process observed by using a TEM.

The metal oxide semiconductor transistor in FIG. 3A is a metal oxide semiconductor transistor with a compensation spacer manufactured according to the manufacturing process of the embodiment (as in FIGS. 1A to 1G). FIG. 3B is a metal oxide semiconductor transistor with a compensation spacer manufactured by using a conventional manufacturing process.

Specifically, in the conventional manufacturing process, since the photoresist material layer of the embodiment is not formed before the second spacer (i.e., the compensation spacer) is formed, during the subsequent etch-back process of the spacer material layer, a height of the second spacer layer 132a is lower than the top surface of the gate electrode layer 116 due to over-etching. However, the height of the second spacer layer 132a of the embodiment (see FIG. 3A) is higher than the top surface of the gate electrode layer 116.

In the conventional process of forming a doped region, due to the insufficient height of the spacer (as in 3B, equal to or even lower than the height of a gate), a dopant is still implanted in the substrate below the spacer, which serves as a mask, during the ion implantation process. As a result, a process window shift occurs. However, in the embodiment (as in 3A), by forming a spacer higher than the gate on a sidewall of the gate, a sufficiently high spacer may effectively block ions from being implanted into the substrate below the spacer. Thus, a metal oxide semiconductor transistor with favorable electrical performance may be manufactured.

Hereinafter, a structure of the metal oxide semiconductor transistor according to an embodiment of the disclosure will be described with reference to FIG. 1G. In addition, although the method for manufacturing the metal oxide semiconductor transistor of the embodiment is described by taking the above method as an example, the method for forming the metal oxide semiconductor transistor of the disclosure is not limited thereto.

Referring to FIG. 1G, the metal oxide semiconductor transistor includes the substrate 100, the gate stack structure 110, the first spacer 120a, the second spacer 132a, the first doped region 126, and the second doped region 136. The gate stack structure 110 is disposed on the substrate 100. The gate stack structure 110 includes the gate dielectric layer 114 and the gate electrode layer 116 on the gate dielectric 114. The first spacer 120a is disposed on the sidewall of the gate stack structure 110. In an embodiment, the top surface of the first spacer 120a is higher than the top surface of the gate stack structure 110 (i.e., the top surface of the gate electrode layer 116). The first doped region 126 is disposed in the substrate 100 and laterally adjacent to a sidewall of the first spacer 120a. In an embodiment, the edge of the first doped region 126 is substantially aligned with the sidewall of the first spacer 120a. The second spacer 132a is disposed on the sidewall of the first spacer 120a. In an embodiment, the top surface of the second spacer 132a is higher than the top surface of the gate stack structure 110 (i.e., the top surface of the gate electrode layer 116). The second doped region 136 is disposed in the substrate 100 and laterally adjacent to the sidewall of the second spacer 132a. In an embodiment, the edge of the second doped region 136 is substantially aligned with the sidewall of the second spacer 132a.

In the embodiment, the spacer manufactured by the process in FIGS. 1A to 1G may ensure that the spacer has a sufficient height. Therefore, the process window shift encountered in the conventional ion implantation process due to the insufficient spacer height may be avoided.

Based on the above, in the metal oxide semiconductor transistor and the manufacturing method thereof according to the embodiments of the disclosure, by controlling the top surface of the photoresist layer to be higher than the top surface of the gate electrode layer, the height of the second spacer formed subsequently may be higher than the top surface of the gate electrode layer. Thus, the second spacer with a sufficient height may effectively block ions from being implanted into the substrate below the second spacer.

Therefore, a manufacturing window shift occurring in the conventional ion implantation process due to an insufficient height of the spacer may be avoided.

Although the disclosure has been described with reference to the above embodiments, they are not intended to limit the disclosure. It will be apparent to one of ordinary skill in the art that modifications to the described embodiments may be made without departing from the spirit and the scope of the disclosure. Accordingly, the scope of the disclosure will be defined by the attached claims and their equivalents and not by the above detailed descriptions.

What is claimed is:

1. A method for manufacturing a metal oxide semiconductor transistor, comprising:
sequentially forming a gate stack structure and a hardmask layer on the gate stack structure on a substrate;
forming a first spacer on a sidewall of the gate stack structure and a sidewall of the hardmask layer;
forming a photoresist layer on a sidewall of the first spacer, wherein a top surface of the photoresist layer is higher than a top surface of the gate stack structure and the top surface of the photoresist layer is lower than a top surface of the first spacer;
removing the hardmask layer and a portion of the first spacer to expose the top surface of the gate stack structure with an etching process having a higher etching selectivity for the hardmask layer and the first spacer than an etching selectivity for the photoresist layer, wherein a top surface of a remaining first spacer is higher than the top surface of the gate stack structure;
removing the photoresist layer; and
forming a second spacer on a sidewall of the remaining first spacer, wherein a top surface of the second spacer is higher than the top surface of the gate stack structure;
wherein before forming the photoresist layer on the sidewall of the first spacer, the method further comprises: forming a first doped region in the substrate, wherein the first doped region is adjacent to the sidewall of the first spacer; and
wherein after forming the second spacer on the sidewall of the remaining first spacer, the method further comprises: forming a second doped region in the substrate, wherein the second doped region is adjacent to a sidewall of the second spacer.

2. The method according to claim 1, wherein the first doped region is a lightly doped drain region.

3. The method according to claim 1, wherein forming the photoresist layer comprises:
forming a photoresist material layer on the substrate to cover the substrate, the first spacer, and the hardmask layer; and
removing a portion of the photoresist material layer to expose a top surface of the hardmask layer and a portion of the sidewall of the first spacer and form the photoresist layer.

4. The method according to claim 3, wherein a material of the photoresist material layer comprises a carbon-based material or a polymer material.

5. The method according to claim 1, wherein a material of the hardmask layer comprises silicon oxide or silicon oxynitride.

6. The method according to claim 1, wherein a material of the first spacer comprises silicon oxide, silicon nitride, or silicon oxynitride.

7. The method according to claim 1, wherein the first spacer comprises:
a first sub-spacer, formed on the sidewall of the gate stack structure; and
a second sub-spacer, formed on a sidewall of the first sub-spacer.

8. The method according to claim 7, wherein a material of the first sub-spacer comprises silicon oxide or silicon oxynitride.

9. The method according to claim 7, wherein a material of the second sub-spacer comprises silicon nitride.

10. The method according to claim 1, wherein forming the second spacer comprises:
conformally forming a spacer material layer on the substrate, the first spacer, and the gate stack structure by performing an atomic layer deposition (ALD) process or a plasma enhanced ALD process; and
removing a portion of the spacer material layer to expose the top surface of the gate stack structure.

11. The method according to claim 1, wherein a material of the second spacer comprises silicon nitride.

12. The method according to claim 1, wherein the second doped region is a source/drain region.

* * * * *